United States Patent
Lim et al.

(10) Patent No.: US 7,923,728 B2
(45) Date of Patent: Apr. 12, 2011

(54) THIN FILM TRANSISTOR ARRAY PANEL AND METHOD OF MANUFACTURING THE SAME

(75) Inventors: Ji-Suk Lim, Daejeon-si (KR); Yong-Gi Park, Siheung-si (KR); Sun-Ja Kwon, Gunpo-si (KR)

(73) Assignee: Samsung Electronics Co., Ltd., Suwon-Si (KR)

( * ) Notice: Subject to any disclaimer, the term of this patent is extended or adjusted under 35 U.S.C. 154(b) by 111 days.

(21) Appl. No.: 11/926,429

(22) Filed: Oct. 29, 2007

(65) Prior Publication Data

US 2008/0179593 A1      Jul. 31, 2008

(30) Foreign Application Priority Data

Jan. 25, 2007   (KR) .................. 10-2007-0007796

(51) Int. Cl.
    *H01L 29/04*        (2006.01)
(52) U.S. Cl. ....... 257/59; 257/88; 257/40; 257/E21.577; 257/E21.627; 257/E21.7; 257/E29.003
(58) Field of Classification Search .................. 257/59, 257/40, 88, E51.006, E21.557, E21.627, 257/E21.7, E29.003
    See application file for complete search history.

(56) References Cited

U.S. PATENT DOCUMENTS

| | | | |
|---|---|---|---|
| 5,636,329 A | 6/1997 | Sukegawa et al. | |
| 6,930,743 B2 | 8/2005 | Park et al. | |
| 7,079,199 B2 | 7/2006 | Ko et al. | |
| 2004/0125318 A1 | 7/2004 | Kohtaka et al. | |

FOREIGN PATENT DOCUMENTS

| | | |
|---|---|---|
| JP | 2002-258315 | 9/2002 |
| JP | 2005-352354 | 12/2005 |
| JP | 2006-047827 | 2/2006 |
| KR | 1020010068332 | 7/2001 |
| KR | 1020010095637 | 11/2001 |
| KR | 1020020012795 | 2/2002 |
| KR | 10200200112795 | * 2/2002 |

(Continued)

*Primary Examiner* — Long Pham
(74) *Attorney, Agent, or Firm* — F. Chau & Associates, LLC

(57) ABSTRACT

A TFT array panel and a manufacturing method thereof,

The TFT array panel includes an insulation substrate, a plurality of gate lines, a plurality of first dummy wiring lines, a gate insulating layer, and a plurality of data lines. The insulation substrate has a display area for displaying an image and a peripheral area outside the display area. The plurality of gate lines are formed in the display area and in a portion of the peripheral area. The plurality of first dummy wiring lines are insulated from the gate lines and formed in the peripheral area. The gate insulating later is formed on the gate lines and the first dummy wiring lines, and has at least one contact hole exposing at least lateral end portions of the first dummy wiring lines. The plurality of gate lines are formed on the gate insulating layer, define a plurality of pixel areas that form the display area by being insulated from the plurality of gate lines and crossing the plurality of gate lines, and are connected with the at least lateral end portions of the first dummy wiring lines through the at least one contact hole. With this configuration, data voltages can be efficiently applied to respective pixel electrodes of the display area even though the data line, particularly the data fan-out unit, in the peripheral area is disconnected.

17 Claims, 22 Drawing Sheets

FOREIGN PATENT DOCUMENTS

| | | |
|---|---|---|
| KR | 1020030035739 | 5/2003 |
| KR | 1020030042371 | 5/2003 |
| KR | 1020030053563 | 7/2003 |
| KR | 1020030057141 | 7/2003 |
| KR | 1020050003282 | 1/2005 |
| KR | 1020050053099 | 6/2005 |
| KR | 1020050070446 | 7/2005 |
| KR | 1020060017162 | 2/2006 |
| KR | 1020060028519 | 3/2006 |
| KR | 1020060077721 | 7/2006 |
| KR | 1020060079032 | 7/2006 |

* cited by examiner

THIN FILM TRANSISTOR ARRAY PANEL AND METHOD OF MANUFACTURING THE SAME

CROSS-REFERENCE TO RELATED APPLICATION

This application claims priority to and the benefit of Korean Patent Application No. 10-2007-0007796 filed on Jan. 25, 2007, the entire contents of which are incorporated herein by reference.

BACKGROUND OF THE INVENTION (a) Technical Field

The present invention relates to a thin film transistor array panel and a manufacturing method thereof.

(b) Discussion of the Related Art

As replacements for the conventional Braun tubes, flat panel displays, such as liquid crystal displays, organic light emitting diode displays, electrophoretic displays, and so on, have been developed.

Such a display device may include an image display member interposed between two display panels, and the image display member can include liquid crystal, light emitting elements, and electrophoretic particles.

One of the two display panels can be provided as a thin film transistor (TFT) array panel which is defined by gate lines and data lines formed on an insulation substrate having a display area and a peripheral area outside the display area, the gate lines and the data lines being respectively insulated from each other and crossing each other. The display area includes a plurality of pixel areas, in which pixel electrodes can be arranged in the form of a matrix.

An end portion of a data line is extended, to the peripheral area for connection with another layer or an external circuit, and the plurality of data lines respectively include a data fan-out unit having a width that gradually narrows at an end portion thereof.

In the peripheral area, the data line, particularly the fan-out unit, can be disconnected due to external impact, scratches, static electricity, and moisture occurring in a manufacturing process, a testing process, and in use of the TFT array panel. When the fan-out unit is disconnected, data voltages cannot be applied to the respective pixel electrodes in the display area through the end portions of the respective data lines, causing operational errors in the TFT array panel.

SUMMARY OF THE INVENTION

Embodiments of the present invention provide a thin film transistor (TFT) array panel that can efficiently apply data voltages to pixel electrodes in a display area when a data line, particularly a fan-out unit in a peripheral area, is disconnected, and a manufacturing method thereof.

A TFT array panel, according to an embodiment of the present invention, includes an insulation substrate, a plurality of gate lines, a plurality of first dummy wiring lines, a gate insulating layer, and a plurality of data lines. The insulation substrate has a display area for displaying an image and a peripheral area outside the display area. The plurality of gate lines are formed in the display area and in a portion of the peripheral area. The plurality of first dummy wiring lines are insulated from the gate lines and formed in the peripheral area. The gate insulating layer is formed on the gate line and the first dummy wiring line, and has at least one contact hole exposing at least lateral end portions of the first dummy wiring line. The plurality of data lines are formed on the gate insulating layer, define a plurality of pixel areas that form the display area by being insulated from the plurality of gate lines and crossing the plurality of gate lines, and are connected with the lateral end portions of the first dummy wiring line through the at least one contact hole.

The plurality of data lines may respectively include a data fan-out unit that becomes narrower at an end portion, thereof, and each of the data lines is connected with lateral end portions of the first dummy wiring line through the at least one contact hole with the data fan-out unit interposed between the end portions.

The data fan-out unit may overlap the first dummy wiring line.

The TFT array panel may further include at least one second dummy wiring line and a plurality of connection wiring lines. The at least one second dummy wiring line is insulated from the gate lines and the first dummy wiring line, and is formed in parallel with the gate lines in the peripheral area. The plurality of connection wiring lines are separately formed from the data lines, and are respectively connected with the at least one second dummy wiring line.

The first dummy wiring line and the at least one second dummy wiring line may be made of the same material as the gate lines.

The connection wiring lines may be made of the same material as the data lines.

The first dummy wiring lines may further include a first control electrode, the data line may further include a first input electrode, the connection wiring line may further include a first output electrode facing the first input electrode, and the TFT array panel may further include a first semiconductor layer formed on the first control electrode and interposed between the gate insulating layer, the first input electrode, and the first output electrode.

The first dummy wiring line may further include a first expansion that is expanded widthwise at a first end of the first dummy wiring line.

The first control electrode may be extended from the first expansion.

The first control electrode, the first semiconductor layer, the first input electrode, and the first output electrode form a first diode.

The at least one second dummy wiring line further includes a plurality of second control electrodes, and the connection wiring line may further include a second input electrode.

The data line may further include a second output electrode facing the second input electrode.

The TFT array panel may further include a second semiconductor layer formed on the second control electrode and interposed between the gate insulating layer, the second input electrode, and the second output electrode.

The second control electrode, the second semiconductor layer, the second input electrode, and the second output electrode form a second diode.

The second output electrodes of non-neighboring data lines form part of second diodes.

Each data line may further include a second expansion connected with the first expansion. The second expansion may overlap the first expansion, and at least one portion of an end portion of the data line may be connected with an end portion of the first dummy wiring line.

The at least one contact hole may include a first contact hole and a second contact hole respectively exposing the first expansion and the end portion of the first dummy wiring line, and the gate insulating layer may further include a third contact hole exposing the second dummy wiring line.

The first expansion and the second expansion may be connected with each other through the first contact hole, the second end portion of the first dummy wiring line and the end portion of the data line may be connected with each other through the second contact hole, and the second dummy wiring line and the connection wiring line may be connected with each other through the third contact hole.

The TFT array panel may further include a passivation layer formed on the data line and the connection wiring line. The passivation may include a fourth contact hole and a fifth contact hole for respectively exposing an end portion of the gate line and the end portion of the data line.

The TFT array panel may further include a first ohmic contact and a second ohmic contact formed on the passivation layer and respectively connected with the end portion of the gate line and the end portion of the data line through the fourth contact hole and the fifth contact hole.

A method for manufacturing a thin film, transistor (TFT) array panel, according to an embodiment of the present invention, includes forming an insulation substrate having a display area for displaying an image and a peripheral area outside the display area, forming a plurality of gate lines in the display area and in a part of the peripheral area and a first dummy wiring line insulated from the gate lines in the peripheral area, forming a gate insulating layer on the gate line and the first dummy wiring line, forming at least one contact hole that exposes at least lateral ends of the first dummy wiring line by patterning the gate insulating layer, and forming a plurality of data lines connected with the lateral ends of the first dummy wiring line through the at least one contact hole on the gate insulating layer.

The plurality of data lines may respectively include a data fan-out unit that becomes narrower at an end portion thereof, and may be respectively connected with the lateral ends of the first dummy wiring line through the at least one contact hole with the data fan-out unit interposed between the ends.

The data fan-out unit may overlap the first dummy wiring line.

At the same time that the gate lines and the first dummy wiring line are formed, a second dummy wiring line insulated from the gate lines and the first dummy wiring line may be formed in parallel with the gate lines in the peripheral area.

At the same time the data lines are formed, a plurality of connection wiring lines separate from the data lines and respectively connected with the second dummy wiring line may be formed.

The first dummy wiring line may further include a first control electrode, a data line may include a first input electrode, and a connection wiring line may include a first output electrode facing the first input electrode.

The method may further include forming a first semiconductor on a gate insulating layer that corresponds to the first control electrode.

The first dummy wiring line may further include a first expansion that is expanded widthwise at an end of the first dummy wiring line, and the first control electrode may be extended from the first expansion.

The second dummy wiring line may further include a second control electrode, the connection wiring line may further include a second input electrode, and the data line may further include a second output electrode facing the second input electrode.

The forming of the first semiconductor may include forming a second semiconductor on a gate insulating layer that corresponds to the second electrode.

The second control electrodes and the second semiconductors may be formed to correspond to second output electrodes of data lines that do not neighbor each other among the plurality of data lines.

The data line may include a second expansion, connected with the first expansion. The second expansion may overlap the first expansion, and at least one portion of an end portion of the data line may be connected with an end portion of the first dummy wiring line.

The at least one contact hole may include a first contact hole and a second contact hole for respectively exposing the first expansion and the end portion of the first dummy wiring line, and the forming of the at least one contact hole may include forming a third contact hole for exposing the second dummy wiring line by patterning the gate insulating layer.

The first expansion and the second expansion may be connected with each other through the first contact hole, the end portion of the first dummy wiring line and the end portion of the data line may be connected with each other through the second contact hole, and the second dummy wiring line and the connection wiring line may be connected with each other through the third contact hole.

The method may further include forming a passivation layer in which additional contact holes are formed, the additional contact holes respectively exposing an end portion of the gate line and an end portion of the data line after the forming of the data lines.

The method may further include forming a plurality of ohmic contacts respectively connected with the end portion of the gate line and the end portion of the data line through the additional contact holes after the forming of the passivation layer.

BRIEF DESCRIPTION OF THE DRAWINGS

The present invention will become more apparent by describing exemplary embodiments thereof in more detail with reference to the accompanying drawings, in which.

DETAILED DESCRIPTION OF THE EMBODIMENTS

Figure 1:
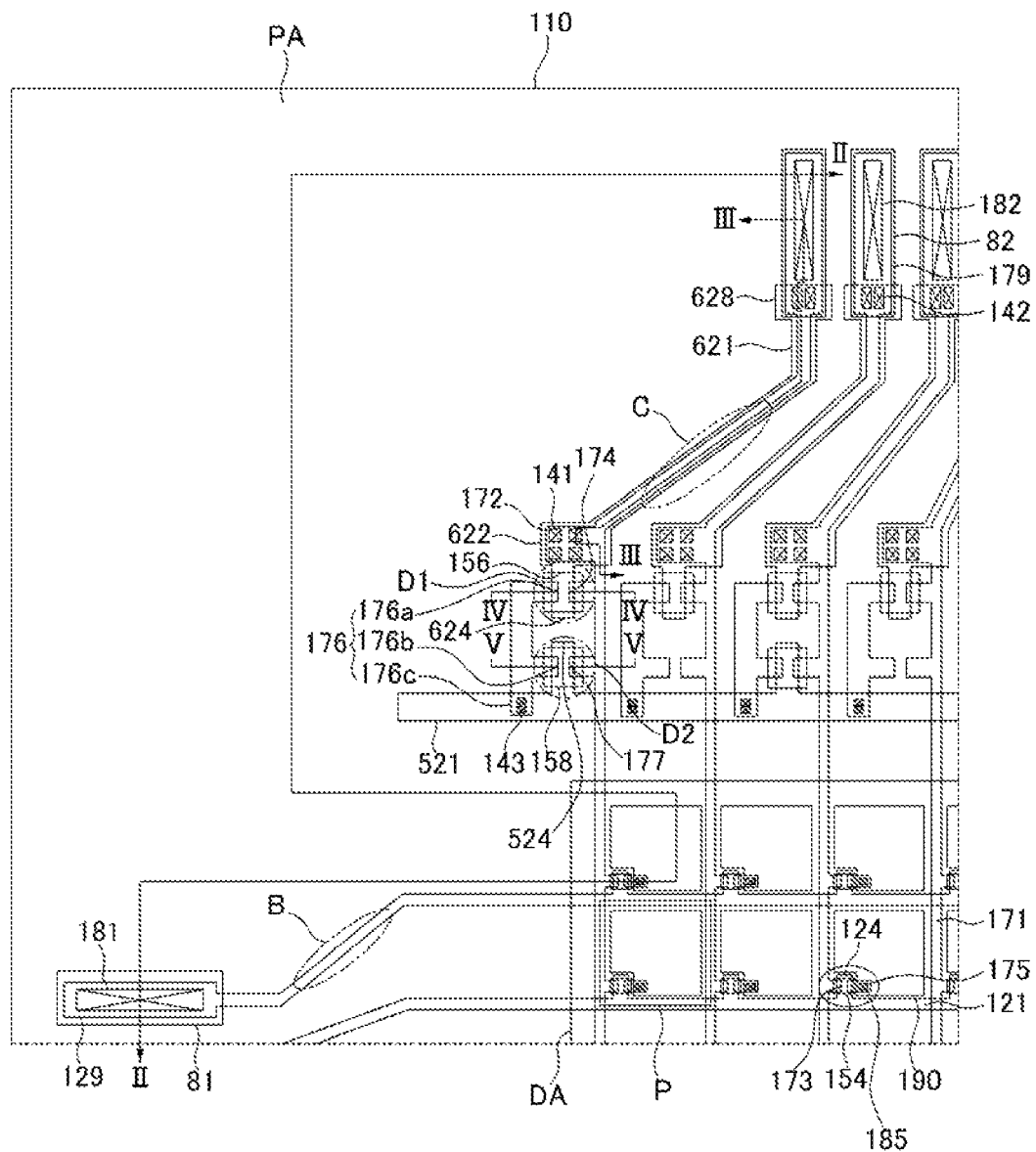
FIG. 1 is a layout view of a thin film transistor (TFT) array panel according to an exemplary embodiment of the present invention.
Figure 2:
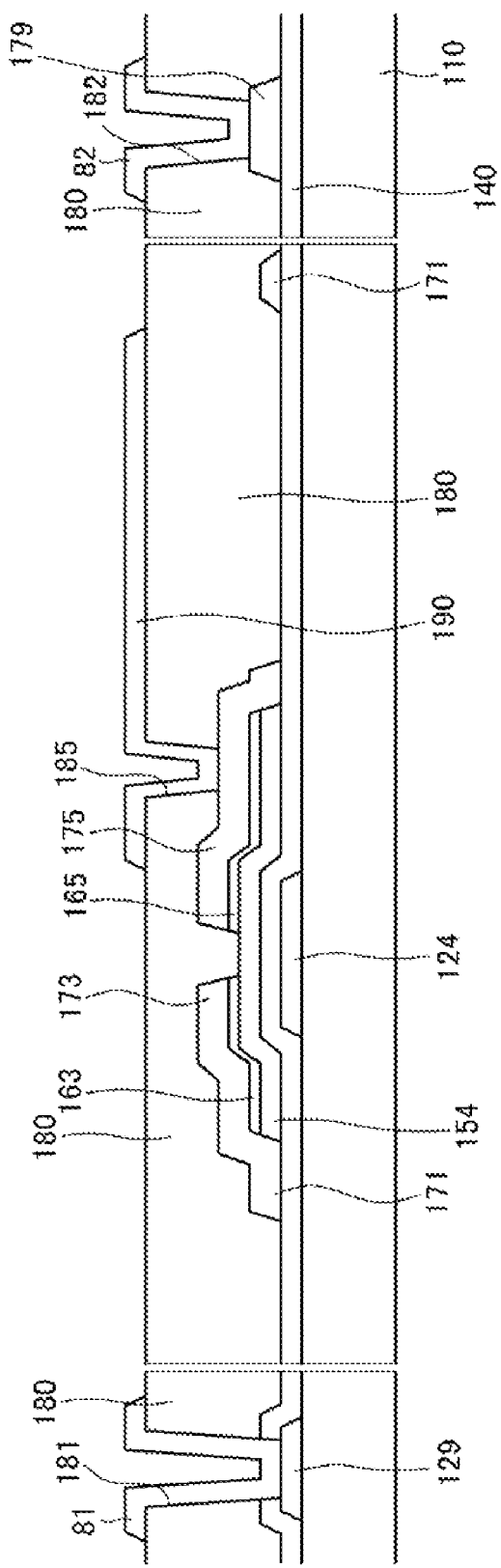
FIG. 2 to FIG. 5 are cross-sectional views of the TFT array panel of FIG. 1, taken along the lines II-II, III-III, IV-IV, and V-V, respectively.
Figure 3:
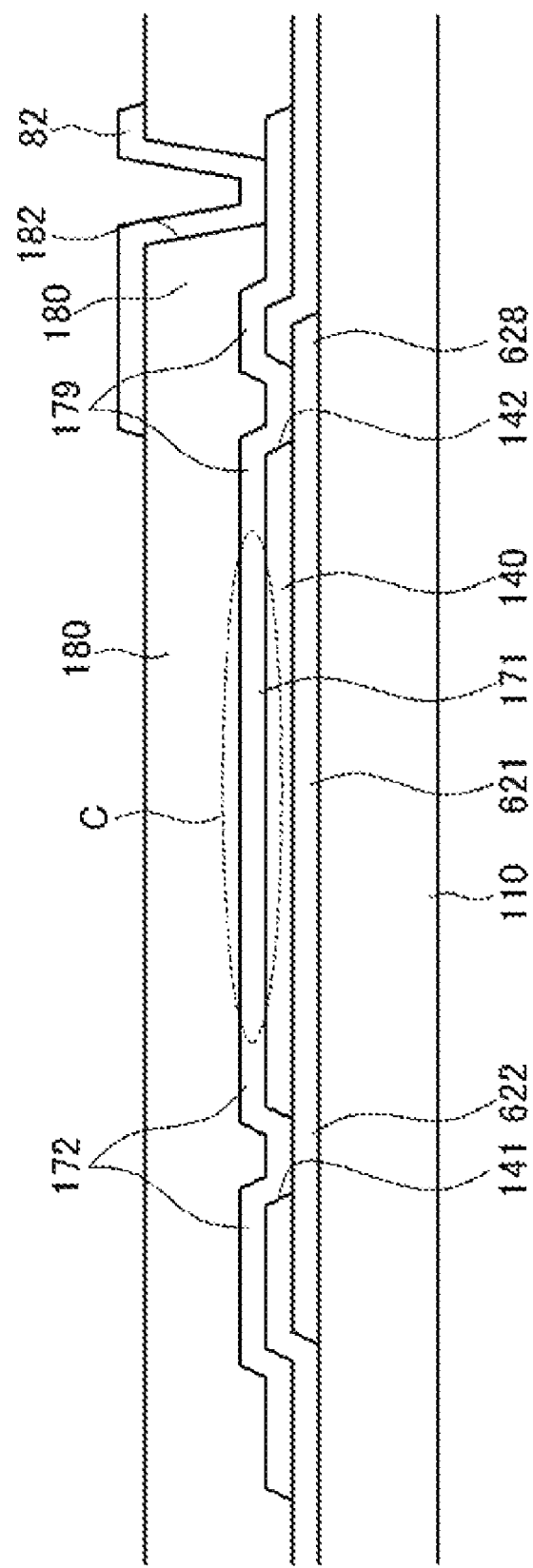
Figure 4:
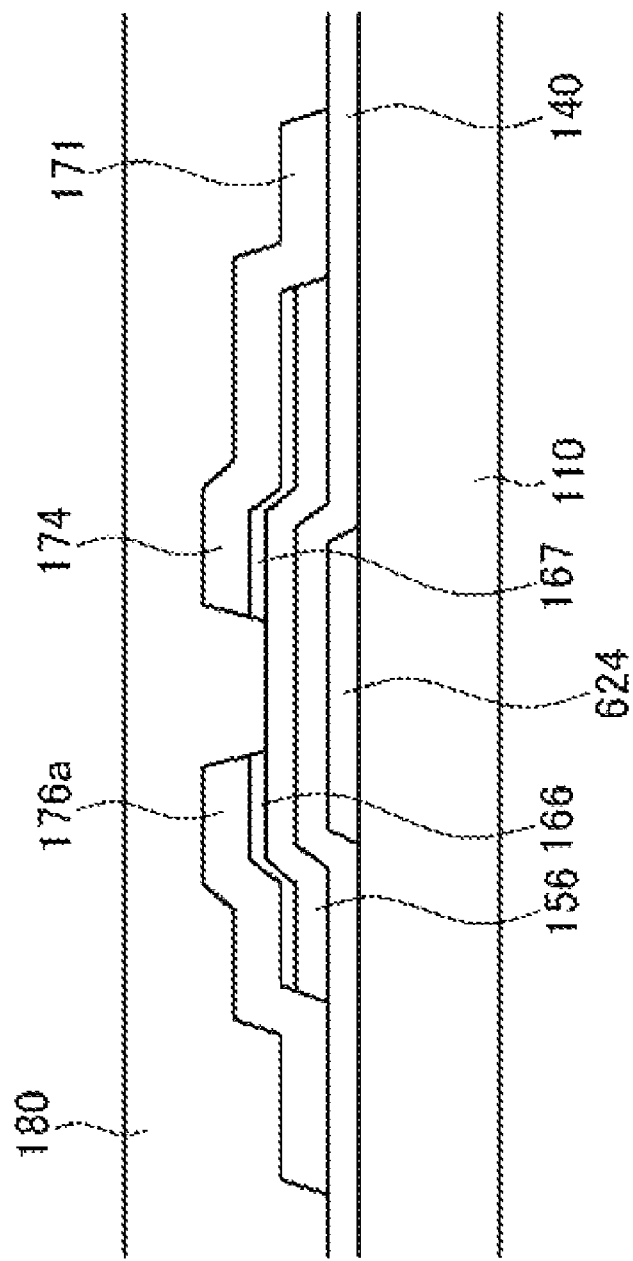
Figure 5:
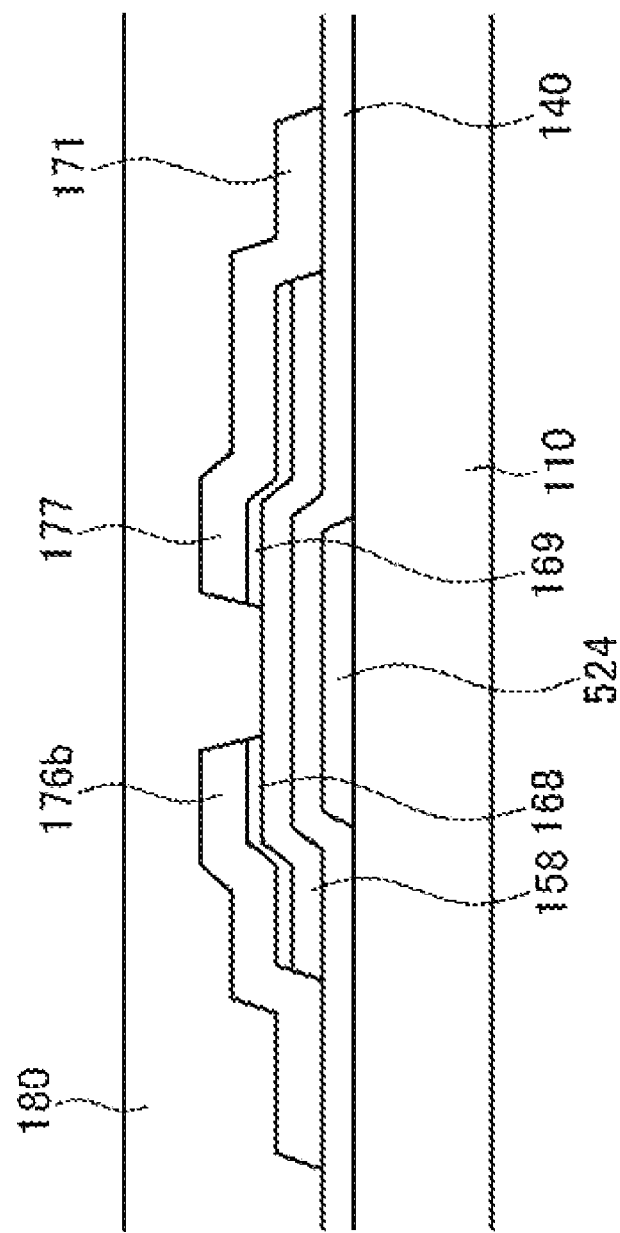

Exemplary embodiments of the present invention will be described more fully hereinafter with reference to the accompanying drawings. This invention may, however, be embodied, in many different forms and should not be construed as limited to the embodiments set forth herein.

Like reference numerals may designate like elements throughout the specification. It will be understood that when an element such as a layer, film, region, or substrate is referred to as being "an" another element, it can be directly on the other element or intervening elements may also be present.

A thin film transistor (TFT) array panel and a manufacturing method of the TFT array panel according to exemplary embodiments of the present invention will now be described in further detail.

A TFT array panel according to an exemplary embodiment of the present invention will be described in further detail with reference to FIG. 1 to FIG. 5.

FIG. 1 is a layout view of a TFT array panel according to an exemplary embodiment of the present invention.

FIG. 2 to FIG. 5 are cross-sectional views of the TFT array panel of FIG. 1, taken along the lines II-II, III-III, IV-IV, and V-V.

The TFT array panel includes an insulation substrate 110 having a display area DA and a peripheral area PA and being made of transparent glass. The display area DA displays an image, and the peripheral area PA is an area adjacent the display area DA.

A plurality of gate lines 121 that transmit gate signals are formed in the display area DA and the peripheral area PA of the insulation substrate 110. The gate lines 121 are extended in a horizontal direction, and each of the gate lines 121 includes a plurality of gate electrodes 124 and a wide end portion 129 for connection with another layer or with an external circuit. In addition, the respective gate lines 121 include a gate fan-out portion B that becomes narrower at the end portion 129.

The gate lines 121 can be made of metal such as aluminum or an aluminum alloy, silver or a silver alloy, copper or a copper alloy, molybdenum or a molybdenum alloy, chromium, tantalum, titanium, etc. The gate lines 121 may have two layers (upper film and lower film) (not shown) having different physical properties. The upper film can be made of a metal with low resistivity, such as an aluminum-containing metal, a sliver-containing metal, or a copper-containing metal for reducing signal delay or voltage drop. The lower film can be made of a material such as Mo, an Mo alloy, or Cr, which has good physical, chemical, and electrical contact characteristics with other materials particularly such as indium tin oxide (ITO) and indium oxide (IZO). An example of a combination of the lower film material and the upper film material is Cr and an Al—Nd alloy.

The gate lines 121 may alternatively have a single-layered structure or a triple-layered structure.

In addition, a first dummy wiring line 621 is formed in the peripheral area PA of the insulation substrate 110. The first dummy wiring line 621 is insulated with the gate lines 121, and overlaps a data fan-out portion C.

The first dummy wiring line 621 is made of the same material as the gate lines 121, and includes a first expansion 622 at a first end of the first dummy wiring line 621 and expanded in a width direction, a first control electrode 624 of a first diode D1 extended from the first expansion 622, and a second end portion 628 partially overlapping an end portion 179 of a data line.

In addition, a second dummy wiring line 521 that is insulated from the gate lines 121 and the first dummy wiring line 621 is formed in parallel with the gate lines 121 in the peripheral area PA of the insulation substrate 110.

The second dummy wiring line 521 is made of the same material as the gate line 121, and includes a second control electrode 524 of a second diode D2 partially overlapping a second output electrode 177 an odd-numbered data line 171. The second dummy wiring line may include a plurality of control electrodes 524 overlapping output electrodes 177 of each odd-numbered data line 171.

A gate insulating layer 140 that is made of silicon nitride (SiNx) is formed on the respective gate lines 121.

In the gate insulating layer 140, a first contact hole 141 and a second contact hole 142 are formed, respectively exposing the first expansion 622 and the second end portion 628 of the first dummy wiring line 621. Since the first expansion 622 and the second end portion 628 respectively have a relatively larger area compared to other areas, the first expansion 622 and the second end portion 628 have enough space in which the first contact hole 141 and the second contact hole 142 can be formed.

A plurality of semiconductor island layers 154, 156, and 158 made of hydrogenated amorphous silicon are formed on the gate insulating layer 140.

The semiconductor layers 154, 156, and 158 respectively overlap the gate electrodes 124 and parts of the respective control electrodes 624 and 524.

Ohmic contact islands 163, 165, 166, 167, 168, 169 are separately formed on the respective semiconductor layers 154, 156, and 158. The ohmic contacts 163, 165, 166, 167, 168, 169 are made of silicide or of n+ hydrogenated amorphous silicon heavily doped with an n-type impurity.

The ohmic contacts 163 and 165, 166 and 167, and 168 and 169 are respectively interposed between the underlying semiconductor layers 154, 156, and 158 and an overlying source electrode 173, drain electrode 175, first input electrode 174, first output electrode 176a, second input electrode 176b, and second output electrode 177 thereon, and reduce the contact resistance therebetween.

A plurality of data lines 171, a plurality of drain electrodes 175, and a connection wiring line 176 are formed on the respective ohmic contacts 163, 165, 166, 167, 168, and 169 and the gate insulating layer 140.

The data lines 171 are extended in a vertical direction and intersect the gate lines 121, and transmit data voltages to respective pixel electrodes 190. Each data line 171 includes a second expansion 172 extended to overlap the first expansion 622, a plurality of source electrodes 173 extended toward the gate electrodes 124, a first input electrode 174 extended toward the first control electrode 624, the second, output electrode 177 extended toward the second, control electrode 524, and a wide end portion 179 for connection with another layer or an external driving circuit. Each of the data lines 171 formed in the peripheral area PA includes a data fan-out unit C that becomes narrower at the end portion 179.

The data fan-out portion C overlaps the first dummy wiring line 621.

Each of a pair of a source electrode 173 and a drain electrode 175 are separated from each other and disposed opposite each other with respect to a gate electrode 124.

The data lines 171 and the drain electrodes 175 are can be made of a refractory metal such as chromium (Cr) or a molybdenum (Mo)-containing metal, tantalum (Ta), and titanium (Ti), and may have a multi-layered structure including a lower film, (not shown) made of Mo, a Mo alloy, or Cr and an upper film (not shown) located on the lower film and made of an aluminum (Al)-containing metal.

A gate electrode 124, a source electrode 173, and a drain electrode 175 along with a semiconductor layer 154 form a thin film transistor (TFT) having a channel formed in the semiconductor layer 154 interposed between the source electrode 173 and the drain electrode 175.

The connection wiring line 176 is formed of the same material as the data lines 171 and the drain electrodes 175 and is separately insulated from the data lines 171, and includes a first output electrode 176a, a second input electrode 176b, and an end portion 176c.

The first output electrode 176a and the first input electrode 174 are separated from each other, and are disposed opposite each other with respect to the first control electrode 624. The second input electrode 176b and the second output electrode 177 are separated from each other and are disposed opposite each other with respect to the second control electrode 524. The end portion 176c of the respective connection wiring lines 176 is connected with the second dummy wiring line 521 through a third contact hole 143.

A first control electrode 624, a first input electrode 174, and a first output electrode 176a form a first diode D1, and a second control electrode 524, a second input electrode 176b, and a second output electrode 177 form a second diode D2.

Static electricity is generated during a manufacturing and testing process of a TFT array panel and a liquid crystal display (LCD) having the TFT array panel. The static electricity can flow along the data lines 171 through an end portion 179 of a data line 171, and it must be dispersed and eliminated in an efficient manner since excessive static electricity may damage a data line 171 and a TFT connected with the data line 171.

When static electricity is applied to the data line 171 through the end portion 179 thereof, the static electricity is also applied to the first control electrode 624 of the first diode D1 through the second expansion 172 and the first expansion 622 so that the channel of the semiconductor layer 156 is opened. Therefore, the static electricity flows to the first output electrode 176a from, the first input electrode 174 and is then dispersed and eliminated through the second dummy wiring line 521.

The static electricity dispersed through the second dummy wiring line 521 is partially dispersed to the second control electrode 524 so that a channel of the semiconductor layer 158 of the second control electrode 524 is opened. Accordingly, the static electricity becomes partially dispersed to another data line 171 through the end portion 176c of the connection wiring line 176, the second input electrode 176b, and the second output electrode 177 so that the static electricity can be more effectively dispersed.

A second control electrode 524 and a semiconductor layer 158 are not formed to correspond to a second output electrode 177 of an even-numbered data line 171 in order to make the number of second diodes D2 equal to half the number of first diodes D1. However, the number of second diodes D2 can be increased by controlling the number of second control electrodes 524 and semiconductor layers 158 according to an exemplary embodiment of the present invention. In addition, the static electricity can be dispersed and eliminated by using only the first diode D1 without forming the second diode D2.

A passivation layer 180 is formed in a single-layered or multi-layered structure on the data lines 171, the drain electrodes 175, the connection wiring lines 176, and the exposed portions of the semiconductor layers 154, 156, arid 158. The passivation layer 180 is made of a photosensitive organic material having a good planarization characteristic, a low dielectric insulating material, such as a-Si:C:O and a-Si:O:F, that is formed by plasma enhanced chemical vapor deposition (PECVD), or silicon nitride (SiNx), which is an inorganic material with a single-layered structure or multi-layered structure.

The passivation layer 180 has a plurality of contact holes 181, 185, and 182 respectively exposing the end portion 129 of the gate line 121, the drain electrode 175, and the end portion 179 of the data line 171.

A plurality of pixel electrodes 190 and a plurality of contact assistants 81 and 82, which are made of ITO or IZO, are formed on the passivation layer 180.

The pixel electrodes 190 are physically and electrically connected to the drain electrodes 175 through the contact holes 185 such that the pixel electrodes 190 receive data voltages from the drain electrodes 175.

The contact assistants 81 and 82 are respectively connected to the end portions 129 of the gate lines 121 and the end portions 179 of the data lines 171 through the contact holes 181 and 182. The contact assistants 81 and 82 protect the end portions 129 and 179 of the gate lines 121 and the data lines 171 and complement the adhesion between the end portions 129 and 179 and external devices such as a driving IC.

In a TFT array panel according to an exemplary embodiment of the present invention, the data lines 171 are electrically connected with the first dummy wiring line 621 through the contact holes 141 and 142 with the data fan-out portion C interposed therebetween.

Therefore, although the data line 171, particularly the data fan-output unit C in the peripheral area PA, is disconnected due to external impact, scratches, static electricity, or moisture, the data voltages can be efficiently applied to the pixel electrodes 190 through the first dummy wiring lines 621.

A manufacturing process of a TFT according to an exemplary embodiment of the present invention will now be descried in further detail with reference to FIG. 1 to FIG. 20.

Figure 6:
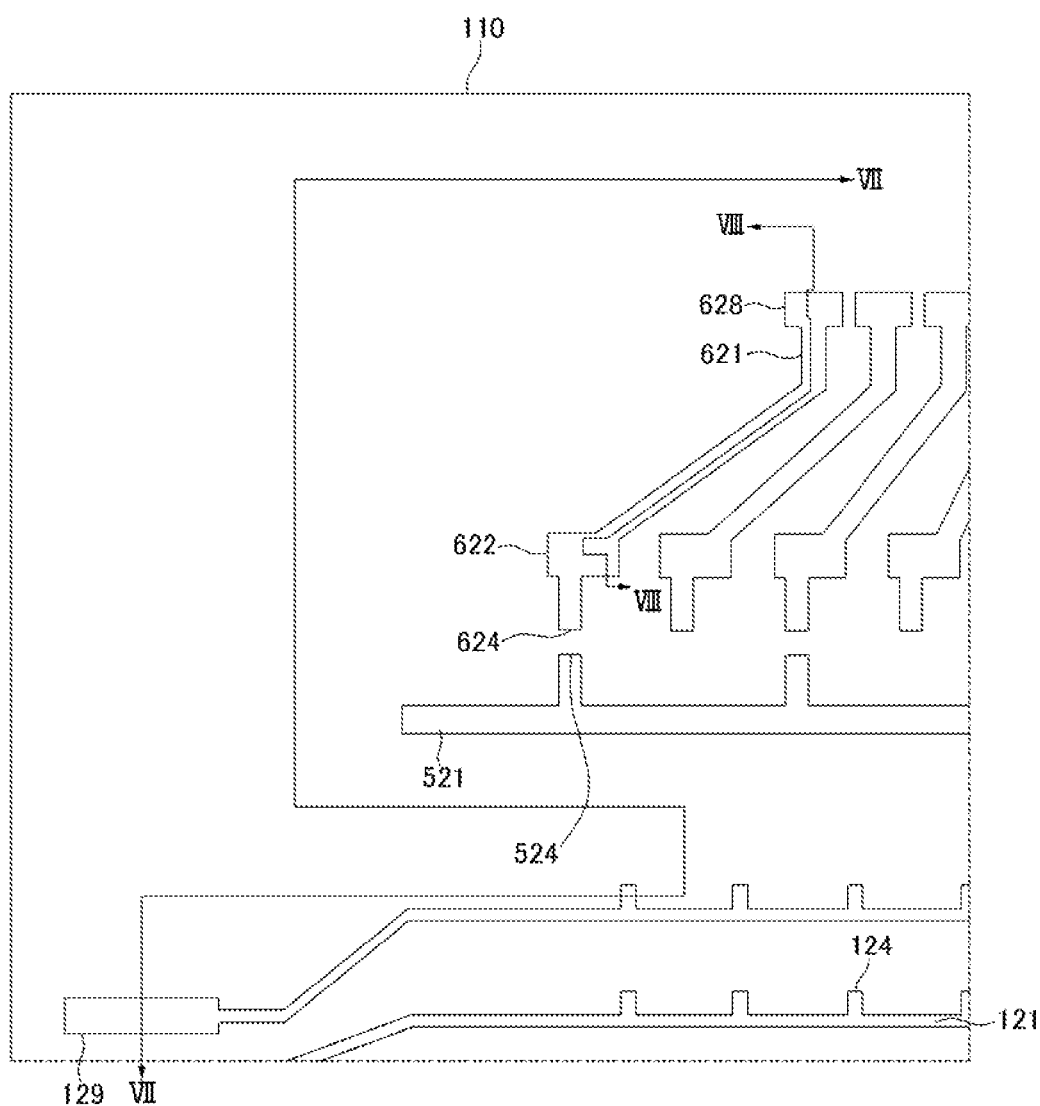
FIG. 6, FIG. 9, FIG. 12, FIG. 15, and FIG. 18 sequentially show a TFT array panel in a manufacturing process of the TFT array panel, according to an exemplary embodiment of the present invention.
Figure 7:
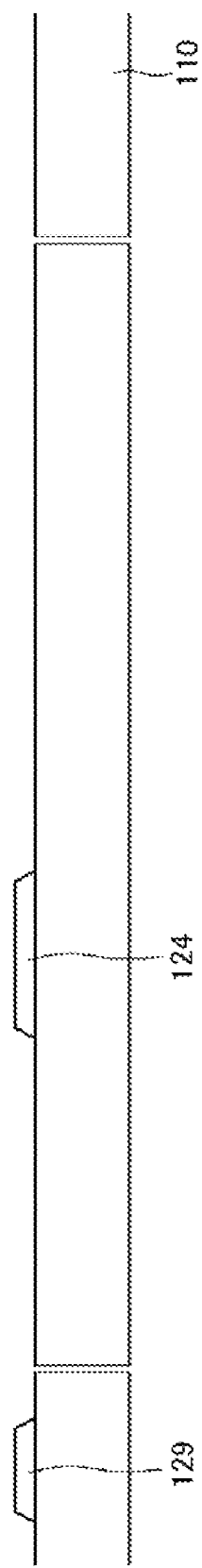
FIG. 7 and FIG. 8 are cross-sectional views of the TFT array panel of FIG. 6, taken along the lines VII-VII and VIII-VIII, respectively.
Figure 8:
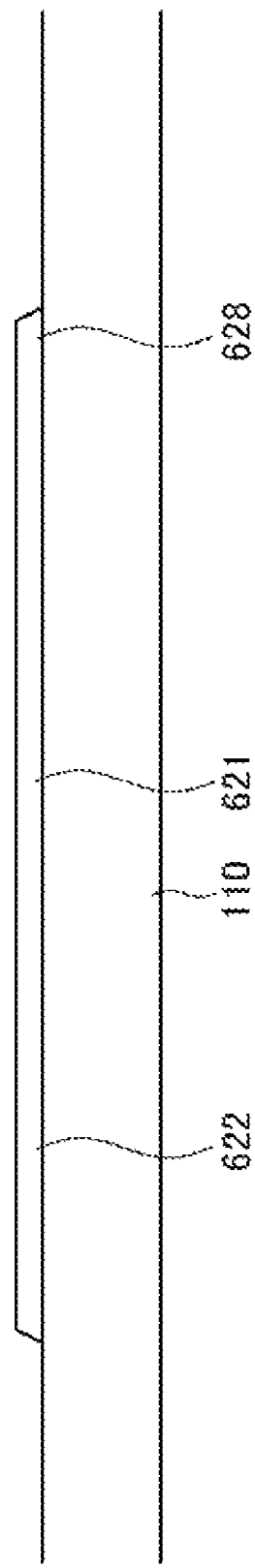
Figure 9:
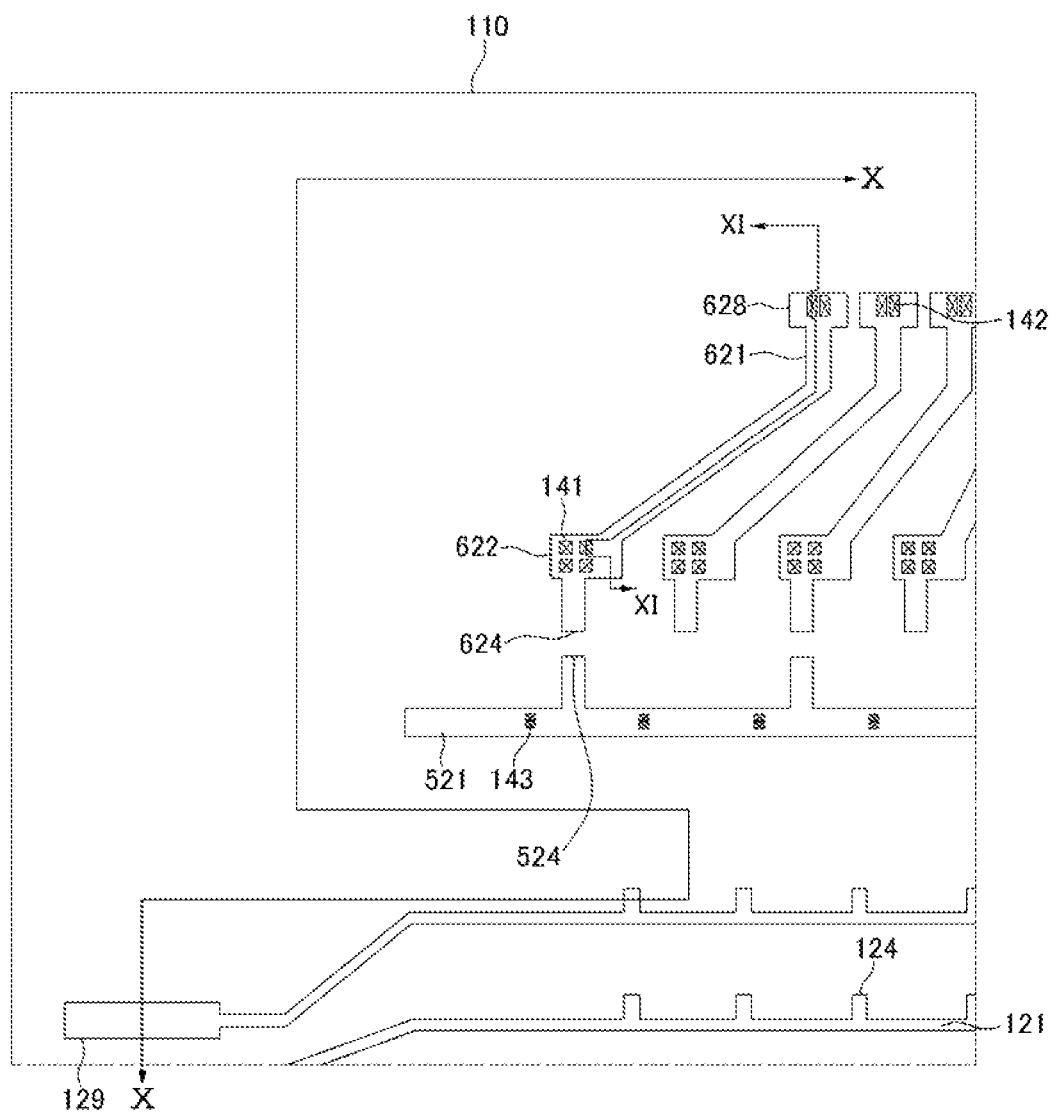
Figure 10:
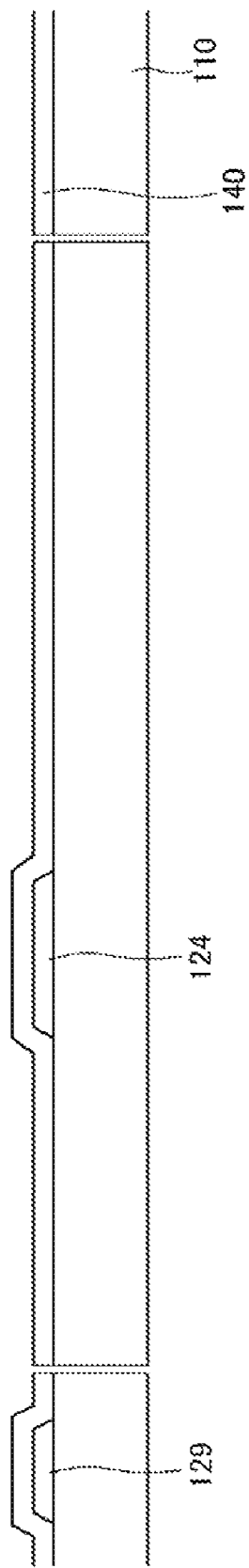
FIG. 10 and FIG. 11 are cross-sectional views of the TFT array panel of FIG. 9, taken along the lines X-X and XI-XI, respectively.
Figure 11:
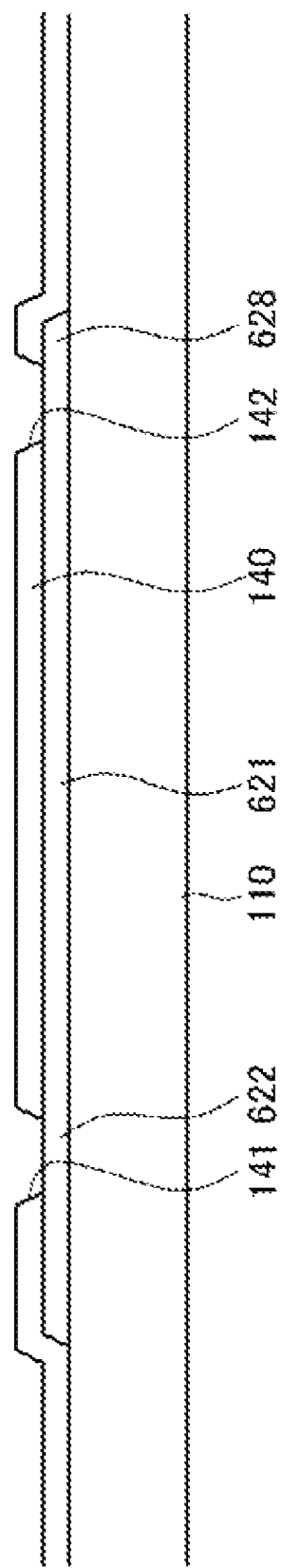
Figure 12:
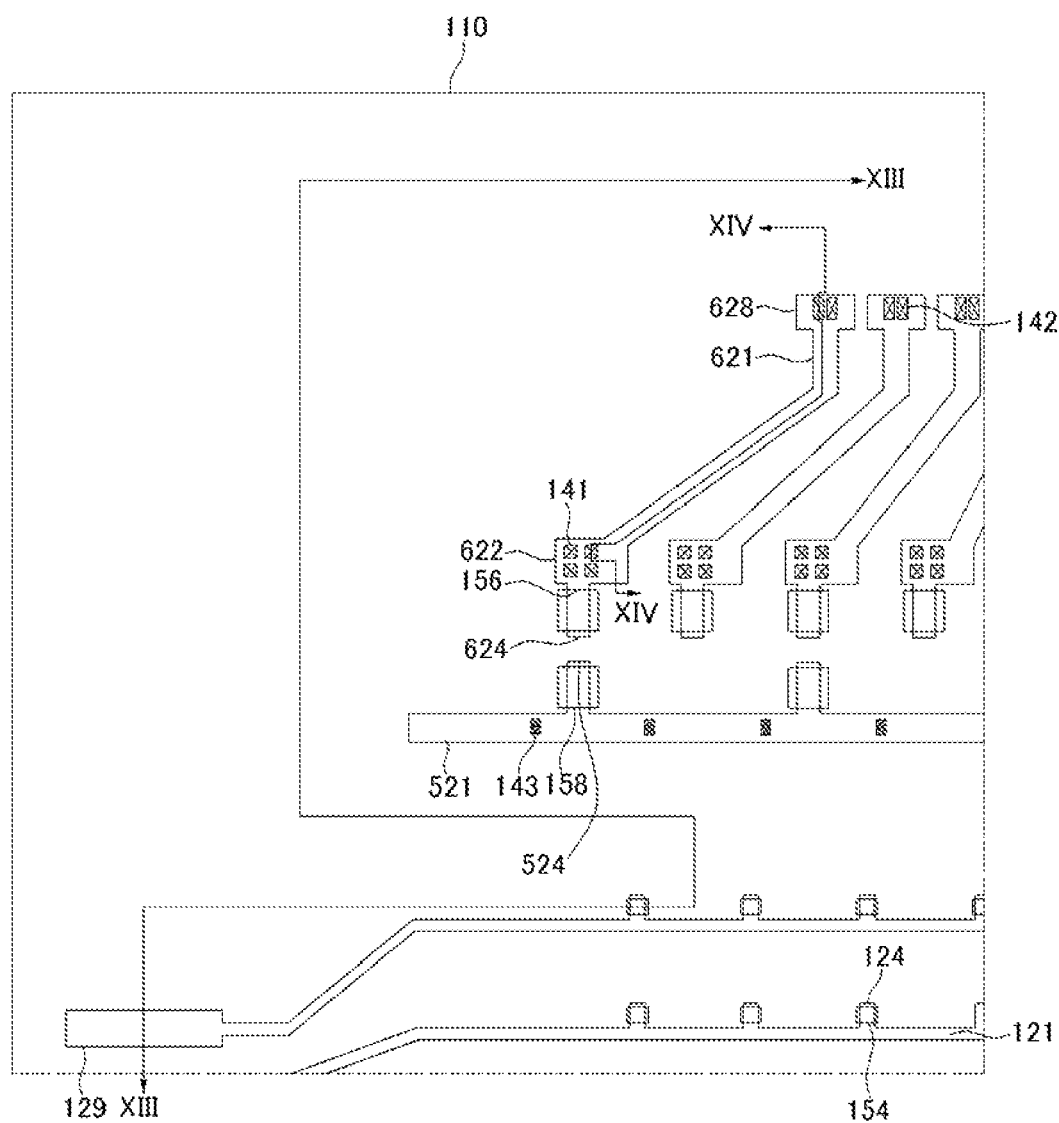
Figure 13:
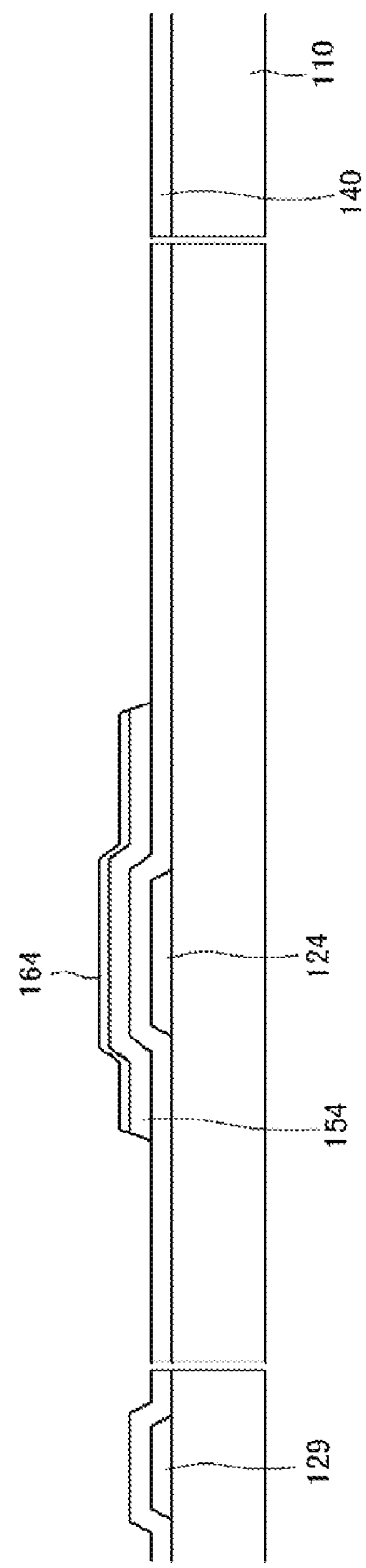
FIG. 13 and FIG. 14 are cross-sectional views of the TFT array panel of FIG. 12, taken along the lines X III-X III and X IV-X IV, respectively.
Figure 14:
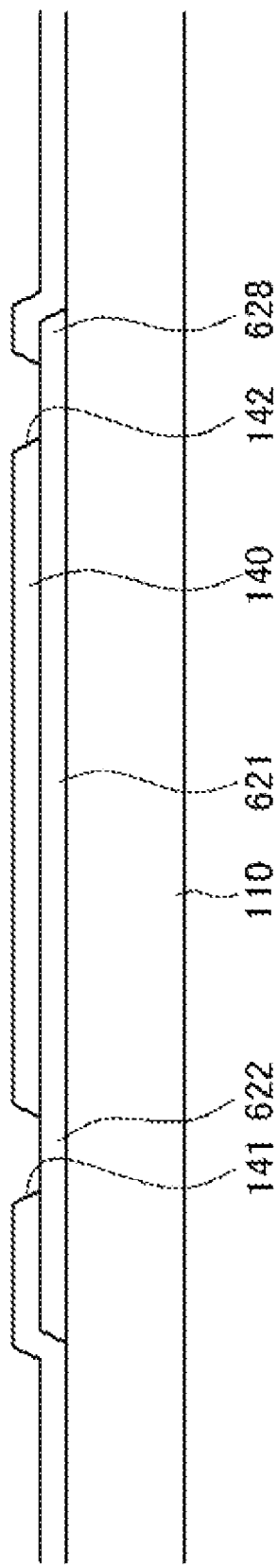
Figure 15:
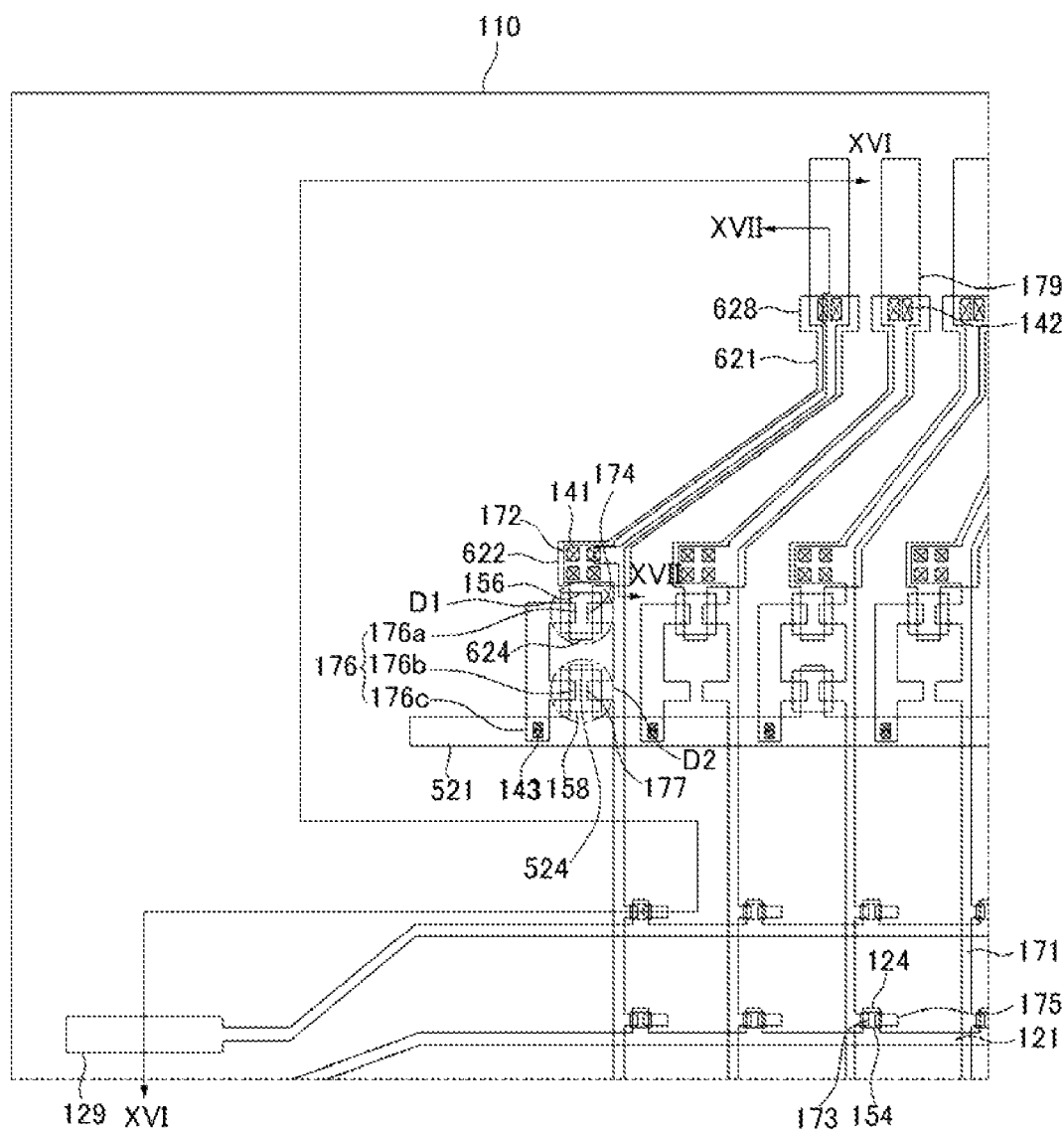
Figure 16:
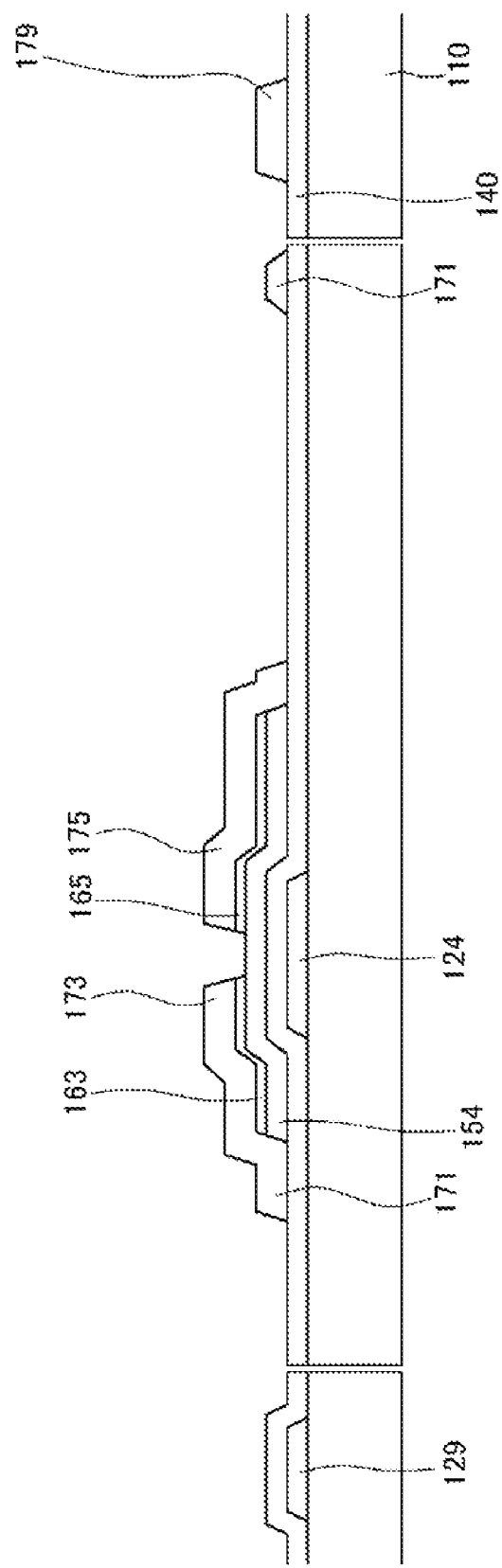
FIG. 16 and FIG. 17 are cross-sectional views of the TFT array panel of FIG. 15, taken along the lines X VI-X VI and X VII-X VII, respectively.
Figure 17:
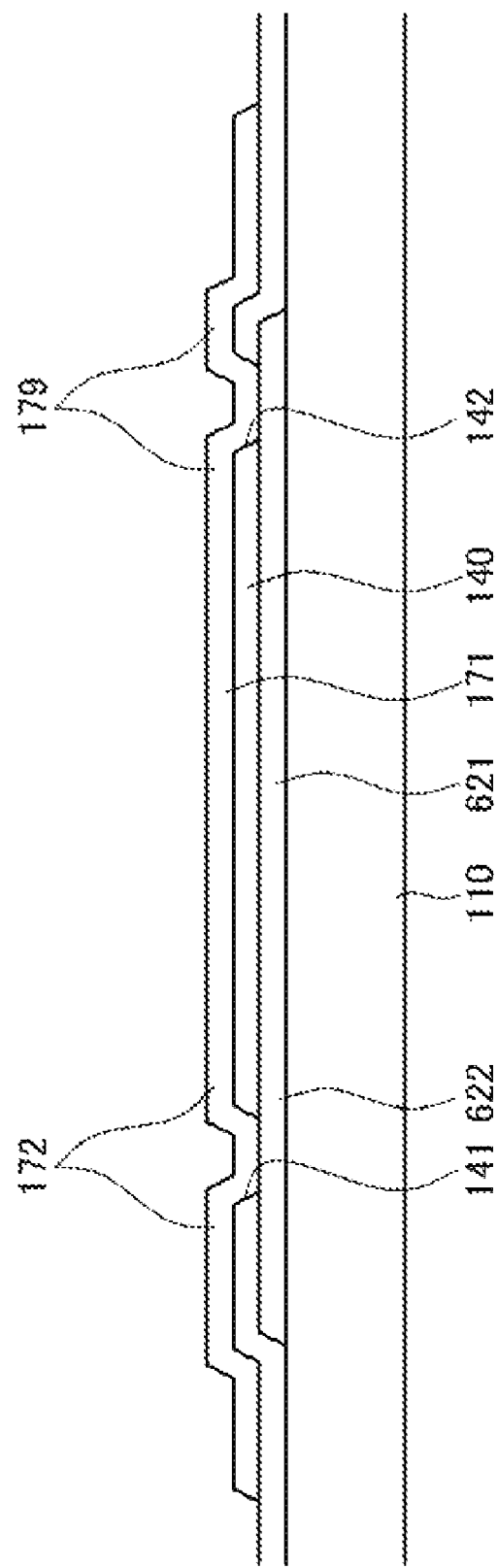
Figure 18:
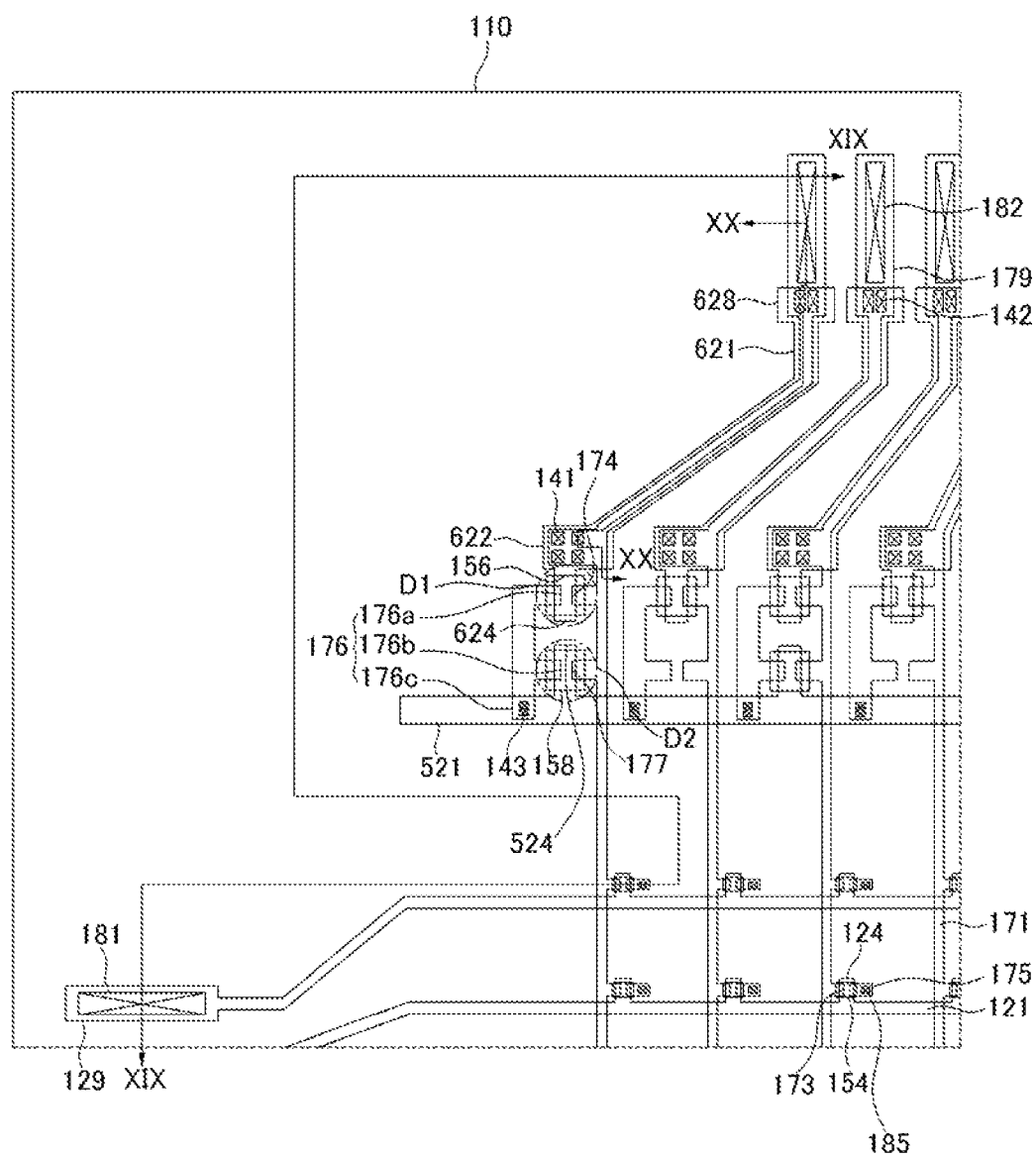
Figure 19:
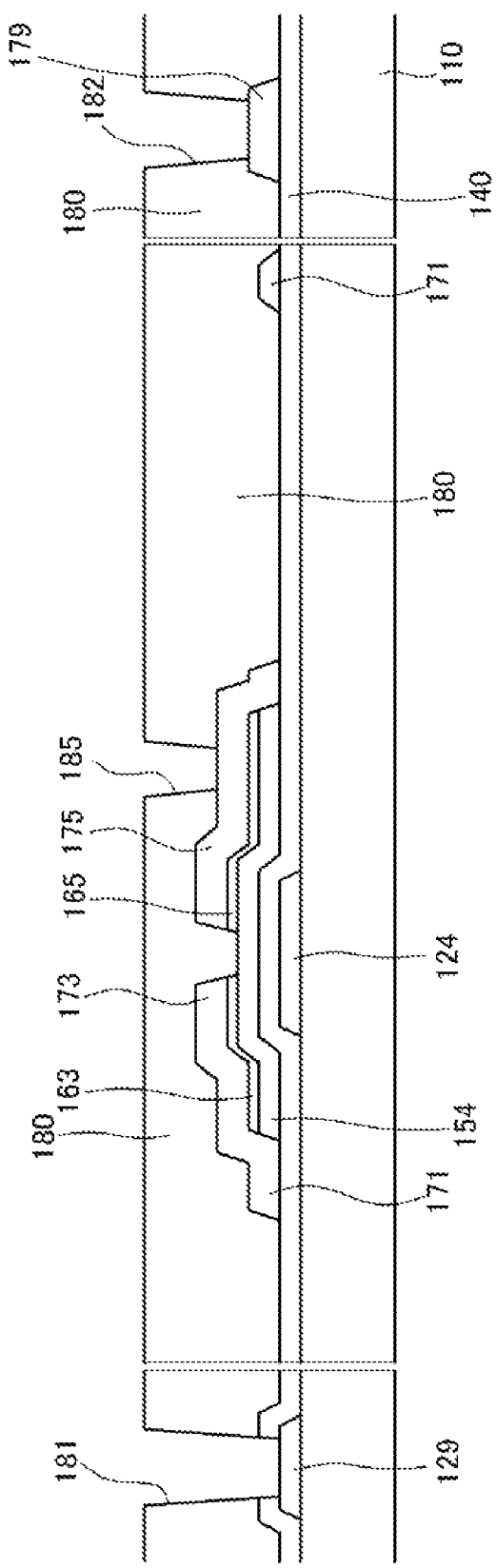
FIG. 19 and FIG. 20 are cross-sectional views of the TFT array panel of FIG. 18, taken along the lines X IX-X IX and X X-X X, respectively.
Figure 20:
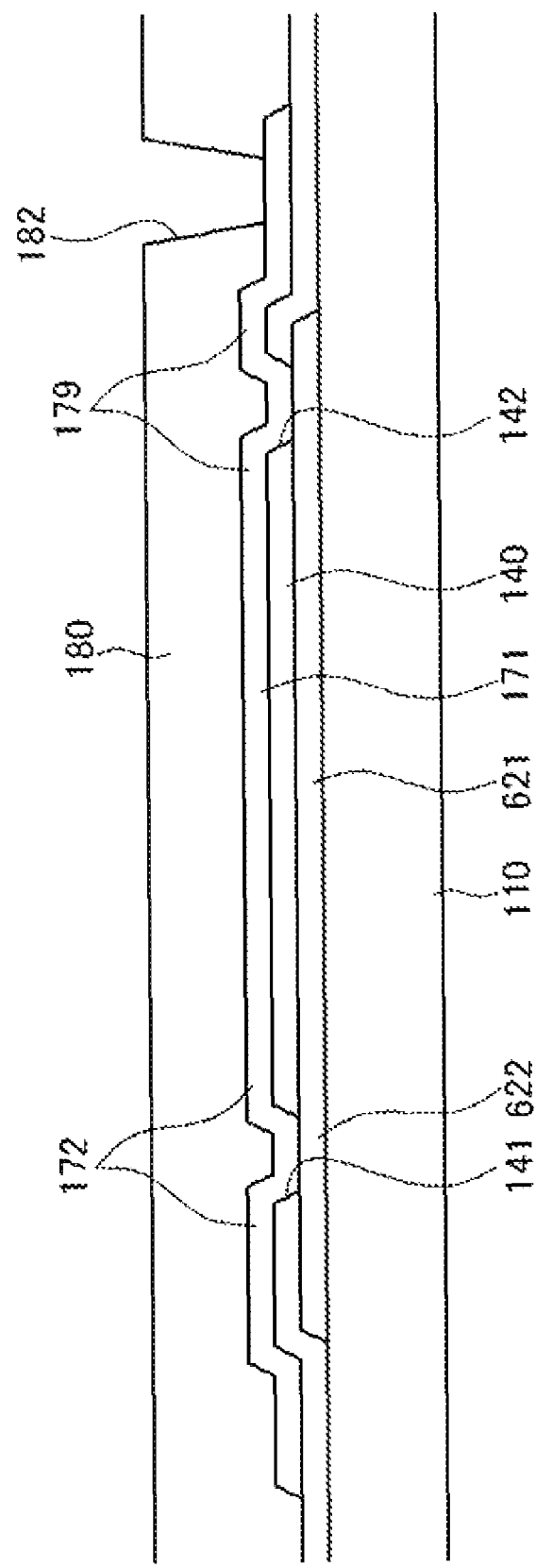

FIG. 6, FIG. 9, FIG. 12, FIG. 15, and FIG. 18 sequentially show a TFT array panel in a manufacturing process of the TFT array panel according to an exemplary embodiment of the present invention, FIG. 7 and FIG. 8 are cross-sectional views of the TFT array panel of FIG. 6, taken along the lines VII-VII and VIII-VIII, FIG. 10 and FIG. 11 are cross-sectional views of the TFT array panel of FIG. 9, taken along the lines X-X and XI-XI, FIG. 13 and FIG. 14 are cross-sectional views of the TFT array panel of FIG. 12, taken along the lines X III-X III and X IV-X IV, FIG. 16 and FIG. 17 are cross-sectional views of the TFT array panel of FIG. 15, taken along the lines X VI-X VI and X VII-X VII, and FIG. 19 and FIG. 20 are cross-sectional views of the TFT array panel of FIG. 18, taken along the lines X IX-X IX and X X-X X.

An insulation layer 110 having a display area DA for displaying an image and a peripheral area PA outside the display area DA is formed, and a conductive layer made of a metal such as aluminum (Al) or an aluminum alloy, silver (Ag) or a silver alloy, copper (Cu) or a copper alloy, molybdenum (Mo) or a molybdenum, alloy, chromium (Cr), tantalum (Ta), titanium (Ti), etc., is formed on the insulation layer using a sputtering method.

Subsequently, as shown in FIG. 6 to FIG. 8, the conductive layer is photo-etched through a photolithography process to form a plurality of gate lines 121 including a plurality of gate electrodes 124 and end portions 129 for connection with an external circuit. In addition, a plurality of first dummy wiring fines 621 respectively including a first expansion 622, a first control electrode 624, and an end portion 628 are formed, and a second dummy wiring line 521 including a second control electrode 524 is also formed.

Next, the gate insulating layer 140 is stacked to cover the first dummy wiring lines 621 and the second dummy wiring line 521 with a method of low pressure chemical vapor deposition (LPCVD) and plasma enhanced chemical vapor deposition (PECVE).

Next, as shown in FIG. 9 to FIG. 11, a first contact hole 141 and a second contact hole 142 respectively exposing the first expansion 622 and the second end portion 628 are respectively formed through patterning the gate insulating layer 140 with a photolithography process. Further, a third contact hole 143 that partially exposes the second dummy wiring line 521 is also formed through the pattering with the photolithography process.

Next, as shown in FIG. 12 to FIG. 14, a hydrogenated amorphous silicon layer and a amorphous silicon layer doped with an n-type impurity are sequentially deposited, and the hydrogenated amorphous silicon layer and the amorphous silicon layer doped with an n-type impurity are patterned so as to form a plurality of semiconductor island layers 154, 156, and 158 and a plurality of resistive contact patterns 164 on the plurality of semiconductor island layers 154, 156, and 158.

Next, a conductive layer formed of a refractory metal such as chromium, a molybdenum-containing metal, tantalum, and titanium is sputtered on the gate insulating layer 140 and the resistive contact patterns 164.

Thereafter, as shown in FIG. 15 to FIG. 17, the conductive layer is photo-etched through the photolithography process to form the data lines 171 and a plurality of drain electrodes 175. The data lines 171 respectively include a plurality of expansions 172, a source electrode 173, a first input electrode 174, a second output electrode 177, and an end portion 179. In addition, a connection wiring line is formed, separately from the data line 171.

A fan-output unit C of the data line 171 formed by the photolithography process overlaps the first dummy wiring line 621. The second expansion contacts the first expansion 621 through the first contact hole 141, and the end portion 179 of the date line 171 partially contacts the end portion 628 of the first dummy wiring line 621 through the second contact hole 142.

Then, a portion of the resistive contact pattern 164 that is not covered by the source electrode 173, the drain electrode 175, the first input electrode 174, the first output electrode 176a, the second input electrode 176b, and the second output electrode 177 is removed so as to divide the resistive contact pattern 164 into a plurality of ohmic contacts 163, 165, 166, 167, 168, and 169 and expose portions of the semiconductor layers 154, 156, and 158 respectively interposed therebetween.

In order to stabilize the exposed surfaces of the semiconductor layers 154, 156, and 158, oxygen plasma treatment may be performed.

Subsequently, the passivation layer 180 is formed by forming a single layer or multi-layers of an organic material having desired planarization characteristics and photosensitivity, a low dielectric constant insulating material such as a-Si:C:O, a-Si:O:F, etc., formed by PECVD, or an inorganic material such as silicon nitride SiNx.

A photoresist is then deposed on the passivation layer 180, and exposure and development of the photoresist are performed using a light mask so as to pattern the photoresist. Then, the passivation layer 180 and the gate insulation layer 140 are patterned by the photolithography process using the photoresist pattern so as to form a plurality of contact holes 181, 185, and 182.

Subsequently, as shown in FIG. 18 to FIG. 20, ITO or IZO is sputtered on the passivation layer 180, and then a plurality of pixel electrodes 190 and a plurality of contact assistants 81 and 82 are formed by a photolithography process according to an exemplary embodiment of the present invention.

A TFT array panel according to an exemplary embodiment of the present invention will now be described with reference to FIG. 21 and FIG. 22.

Figure 21:
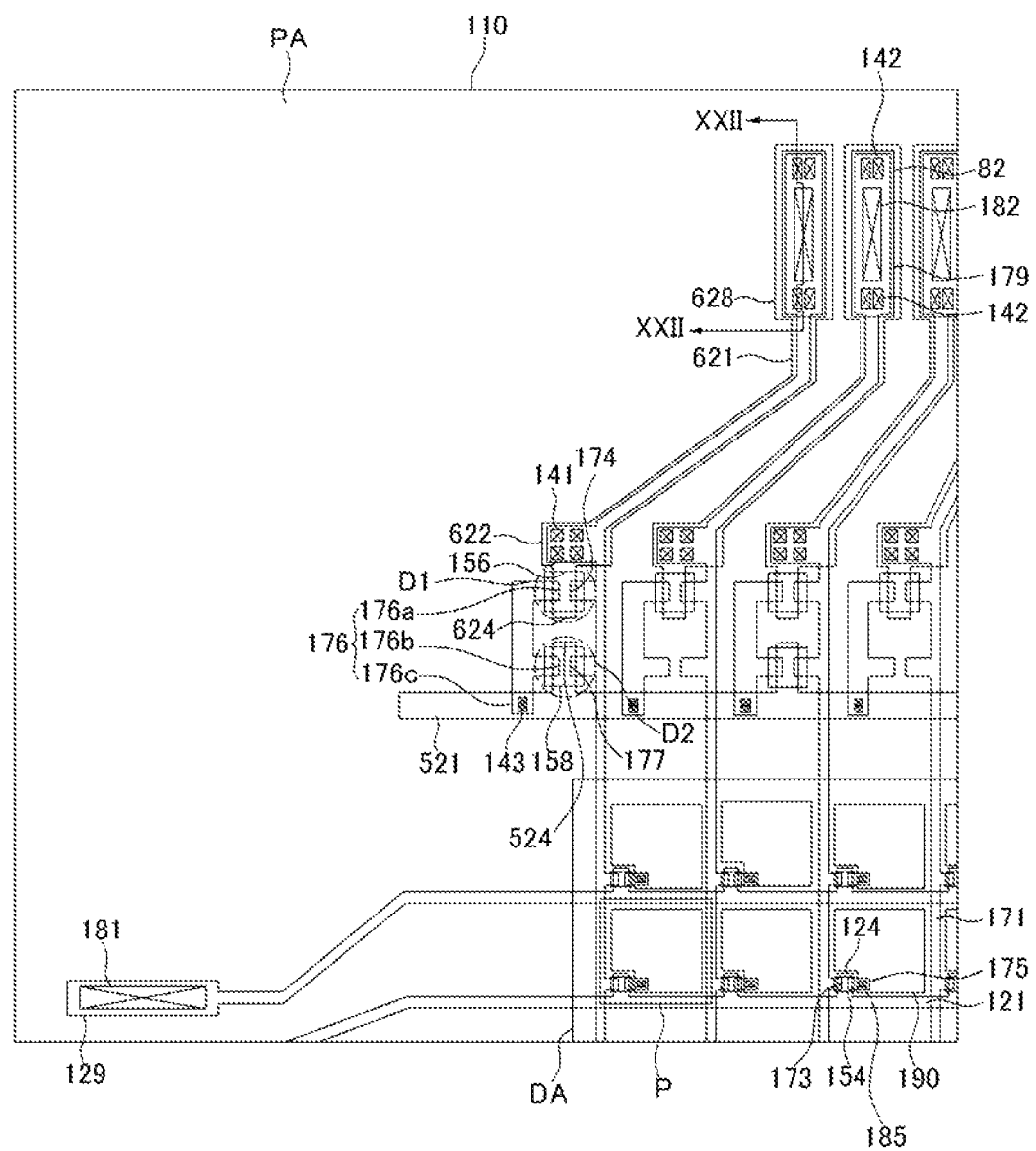
FIG. 21 is a layout view of a TFT array panel according to an exemplary embodiment of the present invention.
Figure 22:
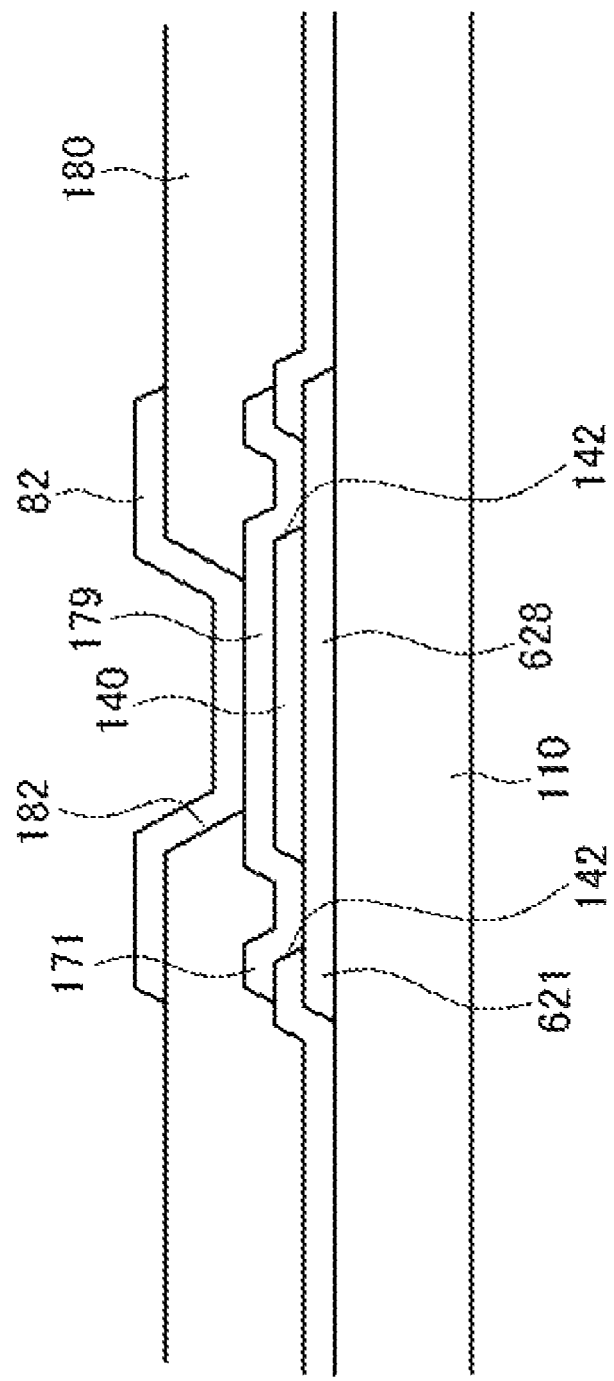
FIG. 22 is a cross-sectional view of the TFT array panel of FIG. 21, taken along the line X X II-X X II.

FIG. 21 is a layout view of a TFT array panel, and FIG. 22 is a cross-sectional view of the TFT array panel of FIG. 21, taken along the line X X II-X X II.

The TFT array panel shown in FIG. 21 and FIG. 22 is substantially the same as the TFT array panel shown in FIG. 1 to FIG. 5, at least except that the end portion 628 of the first dummy wiring line 621 entirely overlaps the end portion 179 of the data line 171, and the second contact holes 142 expose lateral end portions of the end portion 628 of the first dummy wiring line 621. The contact hole 182 formed on the protection layer 180 is interposed between the lateral ends of the end portions 179.

In the TFT array panel shown in FIG. 21 and FIG. 22, contact resistance can be further reduced by increasing a contact area of the end portion 628 of the first dummy wiring line 621 and the end portion 179 of the data line 171.

In alternative embodiments, the TFT array panel does not include the static electricity diodes D1 and D2, the connection wiring line 176, and the second dummy wiring line 521. In this case, the first dummy wiring line 621 does not include the first control electrode 624.

In addition, the first expansion 622 may be extended farther downward so as to overlap a data line 171 in the vicinity of the display area DA, and in this case, the first control electrode 624 may be formed by being extended from an end portion of the first dummy wiring line 621.

As described above, according to the TFT array panel and the method for manufacturing the TFT array panel of the exemplary embodiments of the present invention, the data voltages can be efficiently applied to the respective pixel electrodes in the display area even though the data line in the peripheral area is disconnected.

While this invention has been described in connection with what is presently considered to be practical exemplary embodiments, it is to be understood that the invention is not limited to the disclosed embodiments, but, on the contrary, is intended to cover various modifications and equivalent arrangements included within the spirit and scope of the appended claims.

What is claimed is:

1. A thin film transistor (TFT) array panel comprising:
   an insulation substrate having a display area for displaying an image and a peripheral area outside the display area;
   a plurality of gate lines formed in the display area and in a portion of the peripheral area;
   a plurality of first dummy wiring lines insulated from the gate lines and formed in the peripheral area;
   a gate insulating layer formed on the gate lines and the first dummy wiring lines, and having at least one contact hole exposing at least one portion of a first dummy wiring line; and
   a plurality of data lines formed on the gate insulating layer, insulated from the plurality of gate lines, crossing the plurality of gate lines, and respectively including a data fan-out unit, wherein a data line is connected with the at least one portion of the first dummy wiring line through the at least one contact hole when the image is displayed, and wherein the data fan-out unit overlaps the first dummy wiring line.

2. The TFT array panel of claim 1, wherein the at least one contact hole comprises two or more contact holes, and the data line is connected with the two portions of the first dummy wiring line through the contact holes with the data fan-out unit interposed between the two portions.

3. The TFT array panel of claim 2, wherein the data fan-out unit narrows at an end portion, thereof.

4. The TFT array panel of claim 1, further comprising;
at least one second dummy wiring line insulated from the gate lines and the first dummy wiring line and formed in parallel with the gate lines in the peripheral area; and
a plurality of connection wiring lines separately formed from the data lines, and respectively connected with the at least one second dummy wiring line.

5. The TFT array panel of claim 4, wherein the first dummy wiring line and the at least one second dummy wiring line include the same material as the gate lines.

6. The TFT array panel of claim 4, wherein the connection wiring lines are include the same material as the data lines.

7. The TFT array panel of claim 4, wherein the first dummy wiring line further comprises a first control electrode, a data line comprises a first input electrode, the connection wiring lines comprise a first output electrode facing the first input electrode, and the TFT array panel further comprises a first semiconductor layer formed on the first control electrode and interposed, between the gate insulating layer, the first input electrode, and the first output electrode.

8. The TFT array panel of claim 7, wherein the first dummy wiring line further comprises a first expansion that is expanded in a width direction at a first end of the first dummy wiring line, and the first control electrode is extended from the first expansion.

9. The TFT array panel of claim 7, wherein the first control electrode, the first semiconductor layer, the first input electrode, and the first output electrode form a first diode.

10. The TFT array panel of claim 7, wherein the at least one second dummy wiring line further comprises a plurality of second control electrodes, the connection wiring line comprises a second input electrode, the data line further comprises a second output electrode facing the second input electrode, and the TFT array panel further comprises a second semiconductor layer formed on the second control electrode and interposed between the gate insulating layer, the second input electrode, and the second output electrode.

11. The TFT array panel of claim 10, wherein the second control electrode, the second semiconductor layer, the second input electrode, and the second output electrode form a second diode.

12. The TFT array panel of claim 11, wherein the second output electrode of non-neighboring data lines of the plurality of data lines forms part of a second diode.

13. The TFT array panel of claim 10, wherein each of the data lines further comprises a second expansion connected with the first expansion, and the second expansion overlaps the first expansion, and at least one portion of an end portion of the data line is connected with an end portion of the first dummy wiring line.

14. The TFT array panel of claim 13, wherein the at least one contact hole comprises two or more contact holes, the contact holes comprise a first contact hole and a second contact hole for respectively exposing the first expansion and the end portion of the first dummy wiring line, and the gate insulating layer further comprises a third contact hole for exposing the at least one second dummy wiring line.

15. The TFT array panel of claim 14, wherein the first expansion and the second expansion are connected with each other through the first contact hole, the end portion of the first dummy wiring line and the end portion of the data line are connected with each other through the second contact hole, and the at least one second dummy wiring line and the connection wiring line are connected with each other through the third contact hole.

16. The TFT array panel of claim 14, further comprising a passivation layer formed on the data line and the connection wiring line and having a fourth contact hole and a fifth contact hole for respectively exposing an end portion of the gate line and the end portion of the data line.

17. The TFT array panel of claim 16, further comprising a first ohmic contact and a second ohmic contact formed on the passivation layer, and respectively connected with the end portion of the gate line and the end portion of the data line through the fourth contact hole and the fifth contact hole.

* * * * *